(12) United States Patent
Ai et al.

(10) Patent No.: US 11,114,618 B2
(45) Date of Patent: Sep. 7, 2021

(54) ORGANIC LAYER AND METHOD OF MANUFACTURING THE SAME, DIRECTIONAL HEAT SOURCE ASSEMBLY, AND DISPLAY PANEL

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Yu Ai, Beijing (CN); Xuewu Xie, Beijing (CN); Yubao Kong, Beijing (CN); Shi Sun, Beijing (CN); Hao Liu, Beijing (CN); Ameng Zhang, Beijing (CN); Bowen Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 16/510,843

(22) Filed: Jul. 12, 2019

(65) Prior Publication Data
US 2020/0176682 A1 Jun. 4, 2020

(30) Foreign Application Priority Data
Nov. 30, 2018 (CN) .......................... 201811453929.4

(51) Int. Cl.
*H01L 51/00* (2006.01)
*H01L 27/32* (2006.01)
(Continued)

(52) U.S. Cl.
CPC ...... *H01L 51/0028* (2013.01); *H01L 27/3244* (2013.01); *H01L 51/0005* (2013.01);
(Continued)

(58) Field of Classification Search
CPC ............. H01L 51/0028; H01L 27/3244; H01L 51/0005; H01L 51/5012; H01L 51/5056; H01L 51/5072; H01L 51/5088; H01L 51/5092; H01L 51/56; H01L 2251/558; H01L 51/0027; H01L 51/0026
See application file for complete search history.

(56) References Cited

U.S. PATENT DOCUMENTS

2017/0117471 A1* 4/2017 Takata ................ H01L 51/0007
2017/0342542 A1* 11/2017 Ghosh .................. H01L 51/001

* cited by examiner

*Primary Examiner* — Julia Slutsker
(74) *Attorney, Agent, or Firm* — Kinney & Lange, P.A.

(57) ABSTRACT

In one embodiment, there is provided a method of manufacturing an organic layer. The method includes: forming an organic material solution layer on a substrate; and heating, by a directional heat source assembly, at least a first portion of organic material solution of the organic material solution layer that is inside a to-be-treated area of the substrate, to increase an evaporation rate of the first portion of the organic material solution, whereby, reducing a thickness difference, due to different evaporation rates of the first portion of the organic material solution and a second portion of the organic material solution of the organic material solution layer that is outside the to-be-treated area of the substrate, of the organic layer that is cured from the organic material solution layer.

10 Claims, 3 Drawing Sheets

(51) Int. Cl.
*H01L 51/50* (2006.01)
*H01L 51/56* (2006.01)
(52) U.S. Cl.
CPC ...... *H01L 51/5012* (2013.01); *H01L 51/5056* (2013.01); *H01L 51/5072* (2013.01); *H01L 51/5088* (2013.01); *H01L 51/5092* (2013.01); *H01L 51/56* (2013.01); *H01L 2251/558* (2013.01)

ORGANIC LAYER AND METHOD OF MANUFACTURING THE SAME, DIRECTIONAL HEAT SOURCE ASSEMBLY, AND DISPLAY PANEL

CROSS-REFERENCE TO RELATED APPLICATION

This application claims priority to Chinese Patent Application No. 201811453929.4 filed on Nov. 30, 2018 in the State Intellectual Property Office of China, the disclosure of which is hereby incorporated by reference in its entirety.

TECHNICAL FIELD

The present disclosure relates to the field of display technology, and particularly, to an organic layer and a method of manufacturing the same, a directional heat source assembly, and a display panel.

BACKGROUND

OLED (Organic Light emitting Diode) technology is one of the research hotspots of the current flat display panel. A conventional production process of a large-size OLED adopts the vacuum thermal evaporation method, which has the disadvantages of low material utilization rate and difficulty in improving the production yield, thereby resulting in a high price of the OLED display device.

In order to improve material utilization and reduce costs, an inkjet printing technology is being developed to produce an OLED display device.

However, in the production process using inkjet printing technology, an organic material solution used to form an organic layer in a pixel structure is liable to cause different thicknesses of an edge region and a central region of the organic layer due to difference in evaporation rate, resulting in a coffee ring effect. The coffee ring effect is a technical problem in OLED pixel structure obtained by the inkjet printing technology, especially in the case of natural drying, the coffee ring effect is more likely to occur.

It can be seen that improving the production process to alleviate or eliminate the occurrence of the coffee ring effect in the organic layer and improve the product quality has become a technical problem to be solved.

SUMMARY

According to an aspect of the present disclosure, there is provided a method of manufacturing an organic layer, the method comprising:

forming an organic material solution layer on a substrate; and heating, by a directional heat source assembly, at least a first portion of organic material solution of the organic material solution layer that is inside a to-be-treated area of the substrate, to increase an evaporation rate of the first portion of the organic material solution, whereby, reducing a thickness difference, due to different evaporation rates of the first portion of the organic material solution and a second portion of the organic material solution of the organic material solution layer that is outside the to-be-treated area of the substrate, of the organic layer that is cured from the organic material solution layer.

In some embodiments, both the first portion of the organic material solution and the second portion of the organic material solution are heated by the directional heat source assembly; and a heating efficiency of the directional heat source assembly to the first portion of the organic material solution is greater than a heating efficiency of the directional heat source assembly to the second portion of the organic material solution.

In some embodiments, the to-be-treated area comprises a central region and an edge region surrounding the central region; and a heating efficiency of the directional heat source assembly to a third portion of the organic material solution in the central region is greater than a heating efficiency of the directional heat source assembly to a fourth portion of the organic material solution in the edge region.

In some embodiments, the forming an organic material solution layer on a substrate is performed in a manner that the organic material solution is applied by an inkjet printing method onto a preset area of the substrate so as to form the organic material solution layer, the to-be-treated area being a part of the preset area.

In some embodiments, the directional heat source assembly comprises:

a planar directional heat source configured to generate heat radiation; and a mask comprising: a shielding part configured to shield the heat radiation from the planar directional heat source, and at least an opening part configured to pass the heat radiation from the planar directional heat source therethrough;

wherein the heating at least a first portion of organic material solution of the organic material solution layer further comprises:

aligning the mask with the substrate so that the opening part of the mask is aligned with the to-be-treated area of the substrate; and heating, by the planar directional heat source, the first portion of the organic material solution of the organic material solution layer through the opening part of the mask.

In some embodiments, a size of the opening part and a heating efficiency of the planar directional heat source are adjustable in accordance with one or more of viscosity, hydrophilicity/hydrophobicity, crystallinity, or solid content of the organic material solution.

In some embodiments, the method further comprises:

prior to the heating at least a first portion of organic material solution of the organic material solution layer, determining a shape and a size of the to-be-treated area of the substrate.

In some embodiments, the determining a shape and a size of the to-be-treated area of the substrate further comprises:

determining the shape and the size of the to-be-treated area by analyzing historical data of the organic layer formed at a same process conditions; or determining the shape and the size of the to-be-treated area by simulating test data of the organic layer formed at a same process conditions.

In some embodiments, the heating at least a first portion of organic material solution of the organic material solution layer is performed in a chamber filled with inactive gas, the inactive gas including nitrogen gas.

In some embodiments, the planar directional heat source comprises one of a microwave generator, an infrared generator, an ultraviolet generator, or a laser generator.

In some embodiments, the organic material solution layer is an organic material solution layer for formation of an OLED pixel structure; and the organic layer is an organic light emitting layer of the OLED pixel structure.

In some embodiments, the organic light emitting layer comprises at least one of a light emitting material layer, a hole injection layer, a hole transport layer, an electron injection layer, and an electron transport layer.

According to another aspect of the present disclosure, there is provided a directional heat source assembly for heating at least a first portion of organic material solution of the organic material solution layer that is inside a to-be-treated area of the substrate, to increase an evaporation rate of the first portion of the organic material solution, the directional heat source assembly comprising:

a planar directional heat source configured to generate heat radiation to heat at least the first portion of organic material solution; and a mask provided at a heating surface of the planar directional heat source and configured to control a range of the heat radiation from the planar directional heat source.

In some embodiments, the mask comprises: a shielding part configured to shield the heat radiation from the planar directional heat source, and at least an opening part configured to pass the heat radiation from the planar directional heat source therethrough so that at least the first portion of the organic material solution is heated.

In some embodiments, the planar directional heat source comprises one of a microwave generator, an infrared generator, an ultraviolet generator, or a laser generator.

In some embodiments, a size of the opening part and a heating efficiency of the planar directional heat source are adjustable.

According to yet another aspect of the present disclosure, there is provided an organic layer being manufactured by the method of any one of the above embodiments.

In some embodiments, the organic layer is an organic light emitting layer of an OLED pixel structure; and the organic light emitting layer comprises at least one of a light emitting material layer, a hole injection layer, a hole transport layer, an electron injection layer, and an electron transport layer.

According to still another aspect of the present disclosure, there is provided an display panel, comprising the organic layer of any one of the above embodiments.

DETAILED DESCRIPTION OF THE EMBODIMENTS

In order to enable those skilled in the art to better understand the technical solutions of the present disclosure, an organic layer and a method of manufacturing the same, a directional heat source assembly, and a display panel according to the present disclosure are further described in detail below with reference to the accompanying drawings and embodiments.

Figure 1:
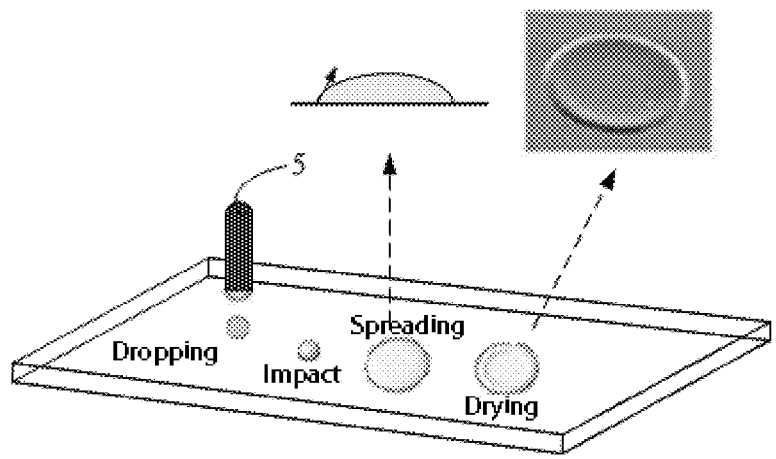
FIG. 1 is a schematic view showing droplet formation during inkjet printing.

As shown in FIG. 1, a process of injecting droplets by an inkjet device 5 includes dropping, impacting, spreading, and drying of the droplets. It has been found by inventor(s) that, according to the principle of inkjet printing, after the droplets fall, the vapor pressure in the edge region of the droplet is small, so that the evaporation rate of the solvent in the edge region of the droplet is great, and the solute is continuously deposited at the edge line of the droplet. As a result, a ring structure is formed (as shown in the upper right corner of FIG. 1), resulting in a coffee ring effect. Accordingly, the present disclosure is directed to alleviate or eliminate the coffee ring effect by improving the evaporation rates of solvents that present in the central and edge regions of the organic layer.

According to an embodiment of the present disclosure, for the problem that the coffee ring effect caused by a thickness difference of the droplet between the central region and the edge region due to different evaporation rates of the organic material solution, there is provided a method of manufacturing an organic layer, which can effectively alleviate or eliminate the coffee ring effect when the organic material solution is cured to form the organic layer.

Figure 2:
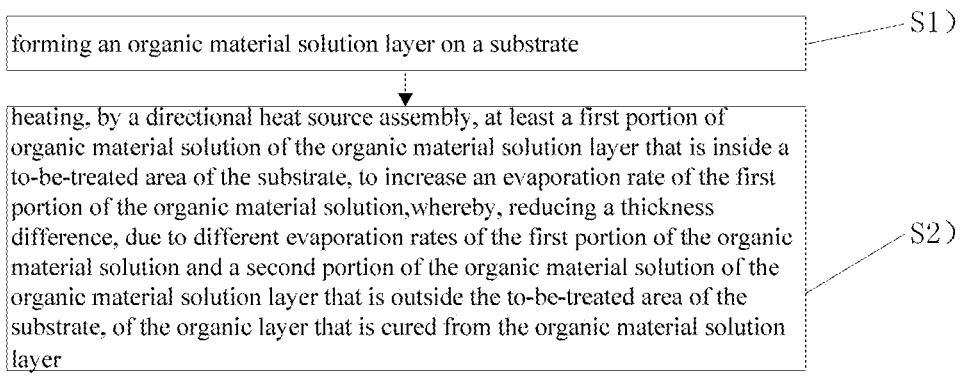
FIG. 2 is a flow chart of a method of manufacturing an organic layer according to an embodiment of the present disclosure.

As shown in FIG. 2, the method of manufacturing an organic layer comprises the following steps.

A step S1) is to form an organic material solution layer on a substrate.

For example, to form an organic material solution layer on a substrate is performed in a manner that the organic material solution is applied by an inkjet printing method onto a preset area of the substrate so as to form the organic material solution layer, a to-be-treated area being a part of the preset area.

Herein, the organic material solution generally refers to a mixture that is formed of a solute including an organic component, a solvent or other auxiliary material, and that can form a liquid organic material solution layer by inkjet printing, dripping, spin coating or the like. The preset area is an area on the substrate on which an organic layer (formed by curing an organic material solution layer) is formed. The to-be-treated area is an area on the substrate on which a coffee ring effect is prone to occur when the organic material solution layer is cured under natural drying conditions to form the organic layer.

A step S2) is to heat, by a directional heat source assembly, at least a first portion of organic material solution of the organic material solution layer that is inside a to-be-treated area of the substrate, to increase an evaporation rate of the first portion of the organic material solution, whereby, reducing a thickness difference, due to different evaporation rates of the first portion of the organic material solution and a second portion of the organic material solution of the organic material solution layer that is outside the to-be-treated area of the substrate, of the organic layer that is cured from the organic material solution layer.

The term "directional" as used herein refers to having a specific directionality. A directional heat source assembly is used for heating, since the directional heat source assembly has good concentrated performance so that the heat source assembly can be better controlled. For example, when the first portion of the organic material solution and the second portion of the organic material solution are heated by using a directional heat source assembly, and a heating efficiency of the directional heat source assembly to the first portion of the organic material solution inside the to-be-treated area is greater than a heating efficiency of the directional heat source assembly to the second portion of the organic material solution, the first portion of the organic material solution has a cured time shorter than that of the second portion of the organic material solution, and thus is cured more quickly.

In some embodiments, the to-be-treated area comprises a central region and an edge region surrounding the central region, and a heating efficiency of the directional heat source assembly to a third portion of the organic material solution in the central region is greater than a heating efficiency of the directional heat source assembly to a fourth portion of the organic material solution in the edge region. For example, the to-be-treated area can be an area where the organic material solution undergoes a coffee ring effect during inkjet printing. Under natural drying conditions, the cured organic material solution is formed into a coffee ring shape, a ring width is in the range of about 10 μm to 15 μm, and a thickness difference between the central region and the edge region of the coffee ring is in the range of about 50 Å to 100 Å. When the method of manufacturing an organic layer according to the embodiments of the present disclosure is employed, by using the directional heat source assembly, a heating efficiency of the directional heat source assembly to the third portion of the organic material solution in the central region (i.e., a region of the cured organic material solution inside the coffee ring) is greater than a heating efficiency of the directional heat source assembly to the fourth portion of the organic material solution in the edge region (i.e., a region of the cured organic material solution within the ring width of the coffee ring), which increases more specifically the evaporation rate in certain region. That is to say, for the coffee ring effect problem, the portion of the organic material solution in the edge region of the to-be-treated area where the coffee ring effect occurs is heated by a small heating efficiency, while the portion of the organic material solution in the central region of the to-be-treated area where the coffee ring effect occurs is heated by a great heating efficiency, so that the evaporation effect of the entire to-be-treated area is substantially the same.

Herein, the directional heat source comprises one of a microwave generator, an infrared generator, an ultraviolet generator, or a laser generator. Correspondingly, the heating method or the accelerating drying method of the directional heat source may be: microwave, infrared, ultraviolet, laser, or the like. In an example, local heating of the liquid organic material solution layer is achieved by microwave heating. The principle of the microwave heating is as follows: the microwave absorption of a material can make the polar molecules in the material interact with the microwave electromagnetic field. Under the action of the alternating electromagnetic field, the polar molecules in the material are polarized and alternately orientated with the polarity of the applied alternating electromagnetic field, such that frequent frictional losses between a large number of polar molecules cause the electromagnetic energy to be converted into heat energy. Microwave heating has at least the following advantages: 1) uniform heating, fast speed, timely control, and sensitive reaction; 2) microwave directionality, that is, microwave emission is linearly propagated in space and is reflected by metal objects; 3) small inertia, that is, rapid control of temperature rise and fall can be realized, the microwave power can be quickly adjusted to the required value to reach an appropriate heating temperature in a few seconds for automation and continuous production.

In embodiments of the present disclosure, the directional heat source assembly comprises: a planar directional heat source and a mask configured for a patterning process. The planar directional heat source is configured to generate heat radiation. The mask comprises: a shielding part configured to shield the heat radiation from the planar directional heat source, and at least an opening part configured to pass the heat radiation from the planar directional heat source therethrough.

In the method according to embodiments of the present disclosure, the step of heating at least a first portion of organic material solution of the organic material solution layer further comprises:

aligning the mask with the substrate so that the opening part of the mask is aligned with the to-be-treated area of the substrate; and heating, by the planar directional heat source, the first portion of the organic material solution of the organic material solution layer through the opening part of the mask, to increase the evaporation rate of the first portion of the organic material solution.

As mentioned above, the to-be-treated area that is heated by the directional heat source assembly is typically the central region of the liquid organic material solution layer rather than the edge region. In combination with the location of the coffee ring effect, the to-be-treated area of the organic material solution layer can be acquired and defined in advance to provide a reference for determining the heating region. For example, prior to the step of heating at least a first portion of organic material solution of the organic material solution layer, the method may further comprise determining the to-be-treated area of the substrate. More specifically, the step of determining the to-be-treated area of the substrate further comprises: determining a shape and a size of the to-be-treated area by analyzing historical data of the organic layer formed at a same process condition; or, determining the shape and the size of the to-be-treated area by simulating test data of the organic layer formed at a same process condition.

The method of manufacturing an organic layer can have an improved heating effect when it is performed in certain heating environment. For example, the heating at least a first portion of organic material solution of the organic material solution layer is performed in a chamber filled with inactive gas, the inactive gas including nitrogen gas. Nitrogen is used as the atmosphere gas to obtain a better heating effect.

Meanwhile, according to embodiments of the present disclosure, there is also provided an organic layer which is manufactured by the abovementioned method.

In the abovementioned method of manufacturing an organic layer and the organic layer which is manufactured by the abovementioned method, a directional heat source assembly is used to heat the to-be-treated area of the organic material solution layer where the coffee ring effect is prone to occur, thereby reducing or eliminating the occurrence of the coffee ring effect in the organic layer formed after curing, and improving the quality of the organic layer product.

According to another embodiment of the present disclosure, for reducing or eliminating the problem of the occurrence of the coffee ring effect in the organic layer, there is provided a directional heat source assembly configured for heating the organic material solution layer on the to-be-treated area of the substrate to increase the evaporation rate of the portion of the organic material solution in the to-be-treated area, and to reduce the difference in thickness of the organic layer cured from the organic material solution layer, so that the cured organic layer has a flat surface.

Figure 3:
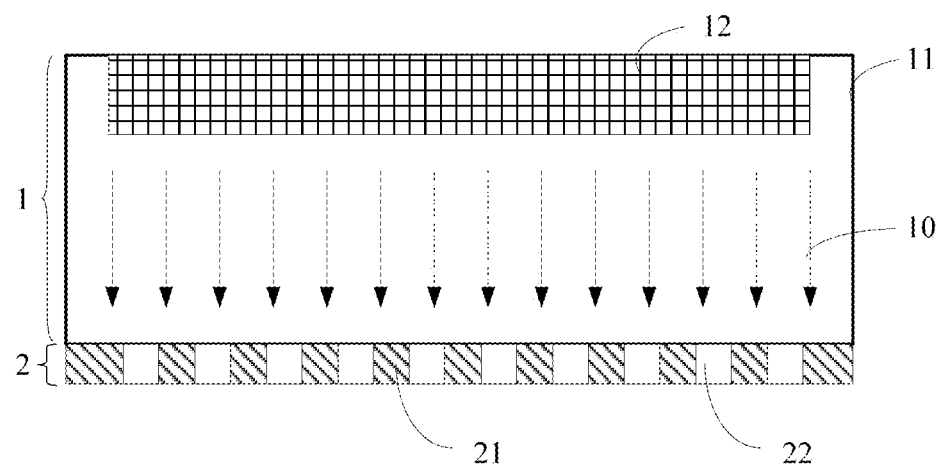
FIG. 3 is a schematic view showing a structure of a directional heat source assembly according to another embodiment of the present disclosure.

Referring to FIG. 3, the directional heat source assembly comprises: a planar directional heat source 1 and a mask 2. The planar directional heat source 1 is used to emit directional heat radiation 10 to the mask 2, and the planar directional heat source 1 can heat the liquid organic material solution layer. The mask 2 is disposed on the heating surface of the planar directional heat source 1 for controlling a range of the heat radiation 10 of the planar directional heat source. For example, when it is applied to the method of manufacturing an organic layer according to the forgoing embodiments, the mask 2 suitably shields the heat radiation 10 of the planar directional heat source 1 to control the heat radiation range of the planar directional heat source 1 to be aligned with the to-be-treated area.

Herein, the planar directional heat source comprises one of a microwave generator, an infrared generator, an ultraviolet generator, or a laser generator. Correspondingly, the heating method or the accelerating drying method of the directional heat source may be: microwave, infrared, ultraviolet, laser, or the like. When it is applied to the method of manufacturing an organic layer according to the forgoing embodiments, the mask 2 suitably shields the heat radiation 10 of the planar directional heat source 1 to achieve a local heating to the to-be-treated area, thereby reduce or eliminate the occurrence of the coffee ring effect in an improved manner.

The mask 2 comprises a shielding part 21 configured to shield the heat radiation 10 from the planar directional heat source 1, and at least an opening part 22 configured to pass the heat radiation from the planar directional heat source therethrough. When it is applied to the method of manufacturing an organic layer according to the forgoing embodiments, the shape and size of the opening part 22 suitably match those of the to-be-treated area on the substrate so that the heat radiation 10 from the planar directional heat source 1 can pass therethrough.

In the directional heat source assembly according to the embodiments of the present disclosure, the mask 2 is disposed on a heating surface of the planar directional heat source 1, and the mask 2 has a small occupied area, which is easy to manufacture and low in cost. For example, since the planar directional heat source 1 is a directional heat source, its heat radiation 10 has a strong directivity, can propagate linearly in a space, and is reflected when it is blocked by a metal object. Therefore, when the heat radiation 10 emitted from the planar directional heat source 1 reaches the mask 2, a portion of the heat radiation 10 passing through the opening part 22 will be incident on the organic material solution in the to-be-treated area, and a portion of the heat radiation 10 reaching the shielding part 21 will be reflected back.

As shown in FIG. 3, the planar directional heat source 1 includes a heat source generator 12, a power source, a waveguide element, a launch tube, an agitator, and the like. The power source is used for supplying a voltage, typically a high voltage, to the heat source generator 12. The heat source generator 12 is configured to continuously generate the heat radiation 10 under the excitation of the power source. The waveguide element is used for transforming the thermal radiation 10 to couple to the launch tube. The agitator is used for reflecting the heat radiation 10 in various directions. The power source, the heat source generator 12, the waveguide element, and the launch tube are located inside the frame 11. The agitator is disposed near the outer opening of the frame 11, and is a fan-shaped metal and is rotatable. When rotating, the agitator reflects the heat radiation 10 towards various directions such that the heat radiation 10 is evenly distributed in the launch tube and is emitted through the mask 2.

For example, the to-be-treated area includes a central region and an edge region, and the heating efficiency of the heat source generator 12 to the central region is greater than the heating efficiency of the heat source generator 12 to the edge region. The edge region has a ring shape, and the ring width ranges from 10 μm to 15 μm. That is to say, in order to specifically handle the to-be-treated area where the coffee ring effect occurs, a small heating efficiency is applied to a portion of the organic material solution in the edge region where the coffee ring effect will occur, and a great heating efficiency is applied to a portion of the organic material solution of the central region where the coffee ring effect will occur, achieving the same effect of the evaporation rate of the organic material solution in the entire area.

In the directional heat source assembly according to the embodiments of the present disclosure, for example, a microwave generator is disposed in the planar directional heat source to provide the microwave heating. To ensure directivity of the heating, and a mask is disposed at the exit of the microwave generator, and the microwave can pass through the mask through the openings on the mask, to achieve localized heating to the to-be-treated area of the organic material solution layer, which ensures the directivity and heating efficiency of the heating, thereby reducing or eliminating the occurrence of the coffee ring effect in the organic layer, and improving the quality of the organic layer product.

According to another embodiment of the present disclosure, taking a pixel structure in which an organic layer is widely used in the display field as an example, for the problem that an organic material solution for forming the organic layer in a preparation process of the pixel structure may cause a thickness difference between an edge region and a central region of a pixel structure due to different evaporation rates, the method of manufacturing an organic layer according to the forgoing embodiments is implemented to prepare organic layers in the pixel structure.

When the method of manufacturing an organic layer according to the forgoing embodiments is implemented to prepare organic layers in the pixel structure, because the heating during the curing process of the organic material solution can be controlled by the directional heat source assembly including the mask, differential heatings to the organic material solution for forming the organic layer in the pixel structure can be performed, which reduces or eliminates the problem of the occurrence of the coffee ring effect in the preparation processes of the organic layers in which the inkjet printing technology is used, thereby improving entire performance of the pixel structure.

The pixel structure includes a plurality of stacked organic layers, and each of the organic layers is formed by an organic material solution layer. For example, the pixel structure is an OLED pixel structure; correspondingly, the organic layer is an organic light emitting layer of the OLED pixel structure.

Figure 4:
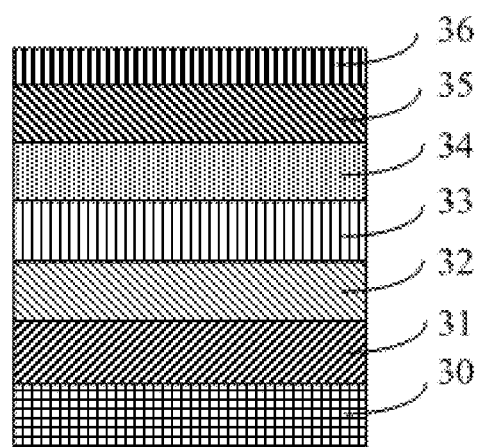
FIG. 4 is a schematic view of a pixel structure including an OLED device.

Generally, the organic light emitting layer in the OLED pixel structure includes at least one of a light emitting material layer, a hole injection layer, a hole transport layer, an electron injection layer, and an electron transport layer. FIG. 4 is a cross-sectional view of an OLED pixel structure having an organic light emitting layer. The OLED pixel structure includes, in order from bottom to top, an anode 30, a hole injection layer 31, a hole transport layer 32, a light emitting material layer 33, an electron injection layer 34, an electron transport layer 35, and a cathode 36. Here, the hole injection layer 31, the hole transport layer 32, the light emitting material layer 33, the electron injection layer 34, and the electron transport layer 35 are all formed by organic material solution, and the organic material solution is cured by heating or drying to form an organic layer.

It is well known that the organic layers of each pixel structure are defined inside the pixel defining layer. In related art, in formation of the pixel structure, the organic material solution injected into the pixel structure is prone to have the coffee ring effect in a portion close to the pixel defining layer. Since the evaporation rate of the solvent in the edge region of the pixel structure is greater than the evaporation rate of the solvent in the central region of the pixel structure, the solute is continuously deposited in the edge region of the pixel structure, thereby forming a coffee ring effect. According to the embodiments of the present disclosure, in formation of the pixel structure where a coffee ring effect is prone to occur, the organic material solution in the edge region of the pixel structure is heated by a small heating efficiency, and the organic material solution in the central region of the pixel structure is heated by a great heating efficiency, such that the organic material solution in the entire pixel structure achieves a substantially uniform evaporation rate and thus the thickness of the cured organic layer is substantially uniform.

Figure 5:
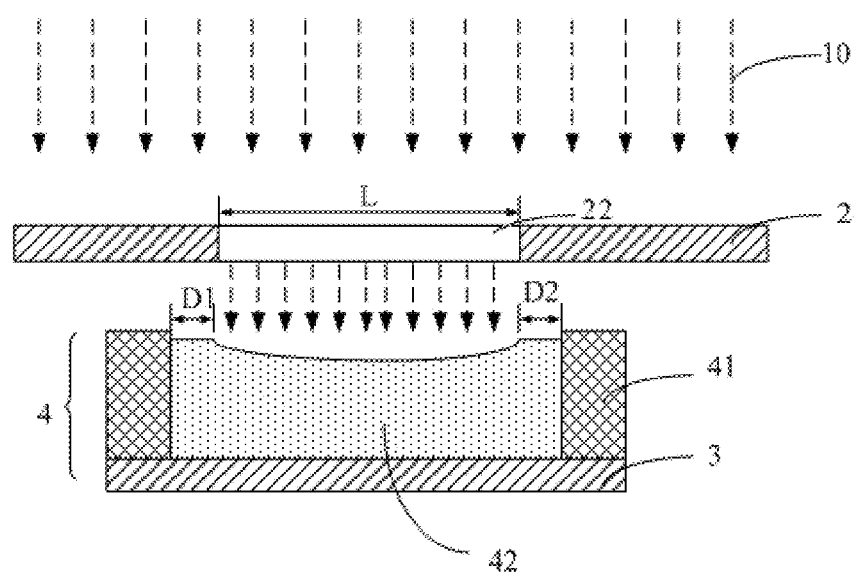
FIG. 5 is a schematic view showing elimination of the coffee ring effect in a pixel structure by the directional heat source assembly according to another embodiment of the present disclosure.

In the preparation process of the OLED pixel structure, referring to FIG. 5, the pixel structure 4 includes a base substrate 3 and a pixel defining layer 41 and a liquid organic material solution 42 formed on the base substrate 3. The organic material solution 42 for forming organic layers is received and cured in the pixel defining layer 41. When the directional heat source assembly according to the foregoing embodiments is applied to the preparation process, the opening part 22 of the mask 2 is aligned with the central region of the pixel structure, and heat radiation 10 from the planar directional heat source heats a portion of the organic material solution 42 in the central region of the pixel structure, and thus evaporation rate of the portion of the organic material solution 42 in the central region of the pixel structure is increased, so that the evaporation rate of the organic material solution 42 in the entire pixel structure is uniform and thus the thickness of the cured organic layer is uniform, thereby reducing or eliminating the occurrence of the coffee ring effect in the organic layers during the preparation process of the OLED pixel structure.

The size L of the opening part and the heating efficiency of the planar directional heat source are adjustable in accordance with one or more of viscosity, hydrophilicity/hydrophobicity, crystallinity, or solid content (concentration) of the organic material solution. For example, for microwave heating, the range of the heating region is adjusted by changing the size of the opening region 22, and the microwave heating efficiency is adjusted by changing the microwave frequency f. Specifically, for the adjustment of the size L of the opening part, in the case where the production line process equipment is stable, the pixel defining layer around the pixel structure and the dropping amount of the organic material solution can be regarded as basically stable, and the size of the opening part L is related to the size of the coffee ring (not related to the heating efficiency).

FIG. 5 is a schematic diagram showing the elimination of the coffee ring effect by using a directional heat source assembly. When the method of manufacturing an organic layer according to the foregoing embodiments is adopted, especially when the solution is dried by microwave heating, the microwave emitted by the planar directional heat source is directed to the organic material solution 42 to be cured through the opening part 22 of the mask 2, for localized heating of a portion of the organic material solution 42. By the flexible adjustments of the size L of the opening part 22 of the mask 2 and of the heating efficiency of the microwave, the occurrence of the coffee ring effect can be reduced or eliminated.

Specifically, as shown in FIG. 5, the edge regions of the organic material solution 42 where a coffee ring effect is prone to occur have the sizes of D1 and D2, respectively. In the case where the type of the organic material solution is constant, the sizes D1 and D2 of the edge regions may be considered to be constant, a size L of the opening part 22 can be calculated from D1 and D2, and finally the size of the opening part 22 is determined based on D1, D2 and L. Regarding adjustment of the heating efficiency, a microwave heating is taken as an example. The microwave heating efficiency is adjusted by changing the microwave frequency f. For example, the higher the crystallinity of the solute is, the more regular the molecular arrangement is, and the higher the heating energy is required to cure the organic material solution, as a result, a higher microwave frequency f is required. For example, the opening part 22 is shown as a rectangle with rounded corners, and the opening size L can be adjusted according to the ring width of the coffee ring (that is, the sizes D1 and D2 of the edge regions) in actual production. By adjusting the size L of the opening region 22 and the heating efficiency of the microwave, the central region of the pixel structure is heated, and thus the evaporation rate of the portion of the organic material solution in the central region is accelerated, so that the evaporation rate of the organic material solution in the entire pixel structure is substantially uniform, thereby reducing or eliminating the occurrence of the coffee ring effect of the organic layer.

Of course, the edge region of the pixel structure can also be heated. In this case, the heating efficiency to the edge region of the pixel structure is less than the heating efficiency to the central region of the pixel structure, which ensures the evaporation rate of the organic material solution 42 in the central region of the pixel structure is greater than the evaporation rate of the organic material solution 42 in the edge region of the pixel structure. For example, the microwave applied to the central region has a microwave frequency f ranging from 1000 MHz to 1500 MHz; the microwave applied to the edge region has a microwave frequency f ranging from 500 MHz to 700 MHz.

In the actual production process, the number of opening parts of the mask is designed according to the substrate size during actual production, and the heating timing is determined according to the number of pixel structures to be heated by the directional heat source assembly. The heating either can be implemented immediately after the organic material solution for some of the pixel structures has been inkjet printed, or can be implemented after the organic material solution for all of the pixel structures has been inkjet printed. The microwave heating has fast speed and small inertia, which can effectively improve tact time.

The pixel structure according to embodiments of the present disclosure uses a directional heat source to locally heat a region of the organic material solution where the coffee ring effect is prone to occur in the manufacture of the organic layer, reducing or eliminating the occurrence of the coffee ring effect in each of the organic layers of the pixel structure, and thus improving the quality of the pixel structure.

According to another embodiment of the present disclosure, there is provided a display panel, which includes an organic layer obtained by performing the method according to the foregoing embodiments, or includes an OLED pixel structure obtained by performing the method according to the foregoing embodiments.

The display panel can include, but is not limited to, any product or component with display function, such as desktop computer, tablet computer, laptop, mobile phone, PDA, GPS, car display, projector, video camera, digital camera, electronic watch, calculator, electronic instrument, meter, LCD panel, electronic paper, TV, monitor, digital photo frame, navigator, etc., and can be applied to many fields such as public display and illusory display.

Due to adopting the abovementioned method of manufacturing an organic layer according to the foregoing embodiments, the display panel according to the embodiments of the present disclosure can effectively reduce or eliminate occurrence of coffee ring effect in each organic layer of the pixel structure in its display area, improving the product quality of the display panel, and owning an improved display performance.

It should be understood that the above embodiments are merely exemplary embodiments employed to explain the principles of the present disclosure, but the present disclosure is not limited thereto. Various changes and modifications can be made by those skilled in the art without departing from the spirit and scope of the disclosure, and such changes and modifications are also considered to fall within the scope of the present disclosure.

What is claimed is:

1. A method of manufacturing an organic layer, the method comprising:
    forming an organic material solution layer on a substrate; and
    heating, by a directional heat source assembly, at least a first portion of organic material solution of the organic material solution layer that is inside a pending area of the substrate and a second portion of the organic material solution of the organic material solution layer that is outside the pending area of the substrate, a heating efficiency of the directional heat source assembly to the first portion of the organic material solution being greater than a heating efficiency of the directional heat source assembly to the second portion of the organic material solution, to increase an evaporation rate of the first portion of the organic material solution, whereby, a thickness difference of the organic layer that is cured from the organic material solution layer is reduced, due to different evaporation rates of the first portion of the organic material solution and the second portion of the organic material solution;
    wherein the directional heat source assembly comprises a planar directional heat source configured to generate heat radiation, and a mask comprising a shielding part configured to shield the heat radiation from the planar directional heat source and at least an opening part having an adjustable size and configured to pass the heat radiation from the planar directional heat source therethrough; and
    wherein the heating at least a first portion of organic material solution of the organic material solution layer further comprises:
        aligning the mask with the substrate so that the opening part of the mask is aligned with the pending area of the substrate; and
        heating, by the planar directional heat source, the first portion of the organic material solution of the organic material solution layer through the opening part of the mask.

2. The method of claim 1, wherein:
the pending area comprises a central region and an edge region surrounding the central region; and
a heating efficiency of the directional heat source assembly to a third portion of the organic material solution in the central region is greater than a heating efficiency of the directional heat source assembly to a fourth portion of the organic material solution in the edge region.

3. The method of claim 1, wherein:
forming the organic material solution layer on the substrate is performed in a manner that the organic material solution is applied by an inkjet printing method onto a preset area of the substrate so as to form the organic material solution layer, the pending area being a part of the preset area.

4. The method of claim 1, wherein:
a size of the opening part and a heating efficiency of the planar directional heat source are adjustable in accordance with one or more of viscosity, hydrophilicity/hydrophobicity, crystallinity, or solid content of the organic material solution.

5. The method of claim 1, further comprising:
prior to the heating at least a first portion of organic material solution of the organic material solution layer, determining a shape and a size of the pending area of the substrate.

6. The method of claim 5, wherein the determining a shape and a size of the pending area of the substrate further comprises:
    determining the shape and the size of the pending area by analyzing historical data of the organic layer formed at a same process conditions; or
    determining the shape and the size of the pending area by simulating test data of the organic layer formed at a same process conditions.

7. The method of claim 1, wherein:
the heating at least a first portion of organic material solution of the organic material solution layer is performed in a chamber filled with inactive gas.

8. The method of claim 1, wherein:
the planar directional heat source comprises one of a microwave generator, an infrared generator, an ultraviolet generator, or a laser generator.

9. The method of claim 1, wherein:
the organic material solution layer is an organic material solution layer for formation of an OLED pixel structure; and
the organic layer is an organic light emitting layer of the OLED pixel structure.

10. The method of claim 9, wherein:
the organic light emitting layer comprises at least one of a light emitting material layer, a hole injection layer, a hole transport layer, an electron injection layer, and an electron transport layer.

* * * * *